(12) United States Patent
Kim et al.

(10) Patent No.: US 10,177,131 B2
(45) Date of Patent: Jan. 8, 2019

(54) SEMICONDUCTOR PACKAGES AND METHODS OF MANUFACTURING THE SAME

(71) Applicant: Samsung Electronics Co., Ltd., Suwon-si OT (KR)

(72) Inventors: Young Lyong Kim, Anyang-si (KR); Jin-woo Park, Seoul (KR); Choongbin Yim, Asan-si (KR); Younji Min, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 12 days.

(21) Appl. No.: 15/442,001

(22) Filed: Feb. 24, 2017

(65) Prior Publication Data

US 2017/0256511 A1    Sep. 7, 2017

Related U.S. Application Data

(60) Provisional application No. 62/302,494, filed on Mar. 2, 2016.

(30) Foreign Application Priority Data

Jun. 13, 2016 (KR) .................. 10-2016-0073308

(51) Int. Cl.
| | |
|---|---|
| *H01L 25/00* | (2006.01) |
| *H01L 23/538* | (2006.01) |
| *H01L 23/31* | (2006.01) |
| *H01L 23/29* | (2006.01) |
| *H01L 23/00* | (2006.01) |
| *H01L 25/10* | (2006.01) |
| *H01L 25/065* | (2006.01) |
| *H01L 21/56* | (2006.01) |

(52) U.S. Cl.
CPC ............ *H01L 25/50* (2013.01); *H01L 23/293* (2013.01); *H01L 23/3114* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 25/105* (2013.01);
(Continued)

(58) Field of Classification Search
CPC ... H01L 24/13; H01L 23/293; H01L 25/0657; H01L 24/81; H01L 24/05; H01L 25/50; H01L 23/3114; H01L 23/5386; H01L 23/5384; H01L 23/5383; H01L 23/5389; H01L 2224/1349; H01L 2224/13026; H01L 2224/05
USPC ....... 438/303, 591, 618, 421, 584, 637, 783, 438/763; 257/774, 522, 419, 773, 758, 257/737, 499, 762, 764, 506
See application file for complete search history.

(56) References Cited

U.S. PATENT DOCUMENTS

| | | |
|---|---|---|
| 6,449,840 B1 | 9/2002 | Le et al. |
| 6,828,510 B1 | 12/2004 | Asai et al. |

(Continued)

*Primary Examiner* — Moin Rahman
(74) *Attorney, Agent, or Firm* — Muir Patent Law, PLLC

(57) ABSTRACT

Provided are a semiconductor package and a method of manufacturing the same. The semiconductor package comprises a substrate, a semiconductor chip on the substrate, an interconnect substrate spaced apart from the semiconductor chip on the substrate and including a conductive member therein, a solder ball on the interconnect substrate and electrically connected to the conductive member, a polymer layer on the interconnect substrate and the semiconductor chip and including an opening through which the solder ball is exposed, and polymer particles in the solder ball and including the same material as the polymer layer.

17 Claims, 19 Drawing Sheets

(52) U.S. Cl.
CPC ........ *H01L 21/568* (2013.01); *H01L 25/0657* (2013.01); *H01L 2224/0401* (2013.01); *H01L 2224/04042* (2013.01); *H01L 2224/04105* (2013.01); *H01L 2224/0557* (2013.01); *H01L 2224/08146* (2013.01); *H01L 2224/08225* (2013.01); *H01L 2224/12105* (2013.01); *H01L 2224/16227* (2013.01); *H01L 2224/48091* (2013.01); *H01L 2224/48227* (2013.01); *H01L 2224/73265* (2013.01); *H01L 2225/06513* (2013.01); *H01L 2225/06517* (2013.01); *H01L 2225/06541* (2013.01); *H01L 2225/06565* (2013.01); *H01L 2225/1035* (2013.01); *H01L 2225/1041* (2013.01); *H01L 2225/1058* (2013.01); *H01L 2225/1082* (2013.01); *H01L 2924/15311* (2013.01)

(56) References Cited

U.S. PATENT DOCUMENTS

| | | | |
|---|---|---|---|
| 8,987,603 B2 | 3/2015 | Shirai et al. | |
| 9,042,113 B2 | 5/2015 | Kim | |
| 9,257,419 B2 | 2/2016 | Yap | |
| 2008/0003822 A1* | 1/2008 | Nam | H01L 21/02074 438/672 |
| 2011/0089577 A1* | 4/2011 | Eom | H01L 25/50 257/778 |
| 2012/0211885 A1* | 8/2012 | Choi | H01L 23/3128 257/737 |
| 2012/0217645 A1* | 8/2012 | Pagaila | H01L 21/486 257/774 |
| 2013/0175702 A1* | 7/2013 | Choi | H01L 23/3128 257/774 |
| 2014/0144575 A1 | 5/2014 | Jeong | |
| 2014/0210101 A1* | 7/2014 | Lin | H01L 24/19 257/774 |
| 2014/0264856 A1 | 9/2014 | Huang et al. | |
| 2015/0171034 A1* | 6/2015 | Yu | H01L 24/02 257/777 |
| 2015/0187743 A1 | 7/2015 | Yu et al. | |
| 2015/0364457 A1 | 12/2015 | Chen et al. | |
| 2015/0380336 A1 | 12/2015 | Grinman et al. | |
| 2015/0380386 A1 | 12/2015 | Vincent et al. | |
| 2016/0027694 A1 | 1/2016 | Truhitte et al. | |
| 2016/0334845 A1* | 11/2016 | Mittal | H01L 23/34 |
| 2017/0110392 A1* | 4/2017 | Lin | H01L 21/4853 |

* cited by examiner

SEMICONDUCTOR PACKAGES AND METHODS OF MANUFACTURING THE SAME

CROSS-REFERENCE TO RELATED APPLICATIONS

This U.S. nonprovisional patent application claims benefit of U.S. provisional Patent Application Ser. No. 62/302,494, filed on Mar. 2, 2016, in the U.S. Patent and Trademark Office, and also claims the benefit of priority under 35 U.S.C. § 119 of Korean Patent Application 10-2016-0073308 filed on Jun. 13, 2016, in the Korean Intellectual Property Office, the entire contents of both of which are hereby incorporated by reference.

BACKGROUND

The disclosed concepts relate to a semiconductor package and a method of manufacturing the same and, more particularly, to a solder ball of a semiconductor package and a method of manufacturing the same.

A semiconductor package is provided to implement an integrated circuit chip to be suitable for use in an electronic appliance. Typically, in a semiconductor package, a semiconductor chip is mounted on a printed circuit board (PCB) and bonding wires or bumps are used to electrically connect the semiconductor chip to the printed circuit board. With the development of the electronic industry, electronic products have increasingly demanded high performance, high speed, and compact size. In order to cope with this trend, there have been developed numerous stacking methods such as a plurality of semiconductor chips being stacked on a single substrate or a package being stacked on another package.

SUMMARY

Embodiments of the present inventive concept provide a semiconductor package and a method of manufacturing the same having an increased reliability.

Embodiments of the present inventive concept provide a simplified method of manufacturing a semiconductor package.

According to exemplary embodiments, the disclosed concepts are directed to a method of manufacturing a semiconductor package comprising: providing an interconnect substrate on a carrier substrate; forming a first solder ball on the interconnect substrate; providing a semiconductor chip on the carrier substrate, the semiconductor chip being spaced apart from the interconnect substrate; forming a polymer layer on the interconnect substrate and the semiconductor chip, the polymer layer covering the first solder ball; and forming an opening in the polymer layer to expose the first solder ball.

According to exemplary embodiments, the disclosure is directed to a semiconductor package comprising: a substrate; a semiconductor chip disposed on the substrate; an interconnect substrate spaced apart from the semiconductor chip on the substrate, the interconnect substrate including a conductive member therein; a solder ball disposed on the interconnect substrate and electrically connected to the conductive member; a polymer layer disposed on the interconnect substrate and the semiconductor chip, the polymer layer including an opening through which the solder ball is exposed; and polymer particles formed in the solder ball and including the same material as the polymer layer, wherein at least some of the polymer particles are formed in a top half of the solder ball.

According to exemplary embodiments, the disclosure is directed to a method of manufacturing a semiconductor package, the method comprising: providing an interconnect substrate on a carrier substrate; forming a solder pad on the interconnect substrate; forming a first solder bump on the solder pad; providing a semiconductor chip on the carrier substrate, the semiconductor chip being spaced apart from the interconnect substrate; forming a polymer layer on the interconnect substrate and the semiconductor chip, the polymer layer covering the first solder bump; and forming an opening in the polymer layer to expose a portion of the first solder bump, wherein the first solder bump is disposed on and contacts the solder pad.

DETAILED DESCRIPTION OF EMBODIMENTS

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a solder bump or solder ball, and/or an external wiring.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Hereinafter, methods of manufacturing semiconductor packages will be described according to exemplary embodiments.

Figure 1A:
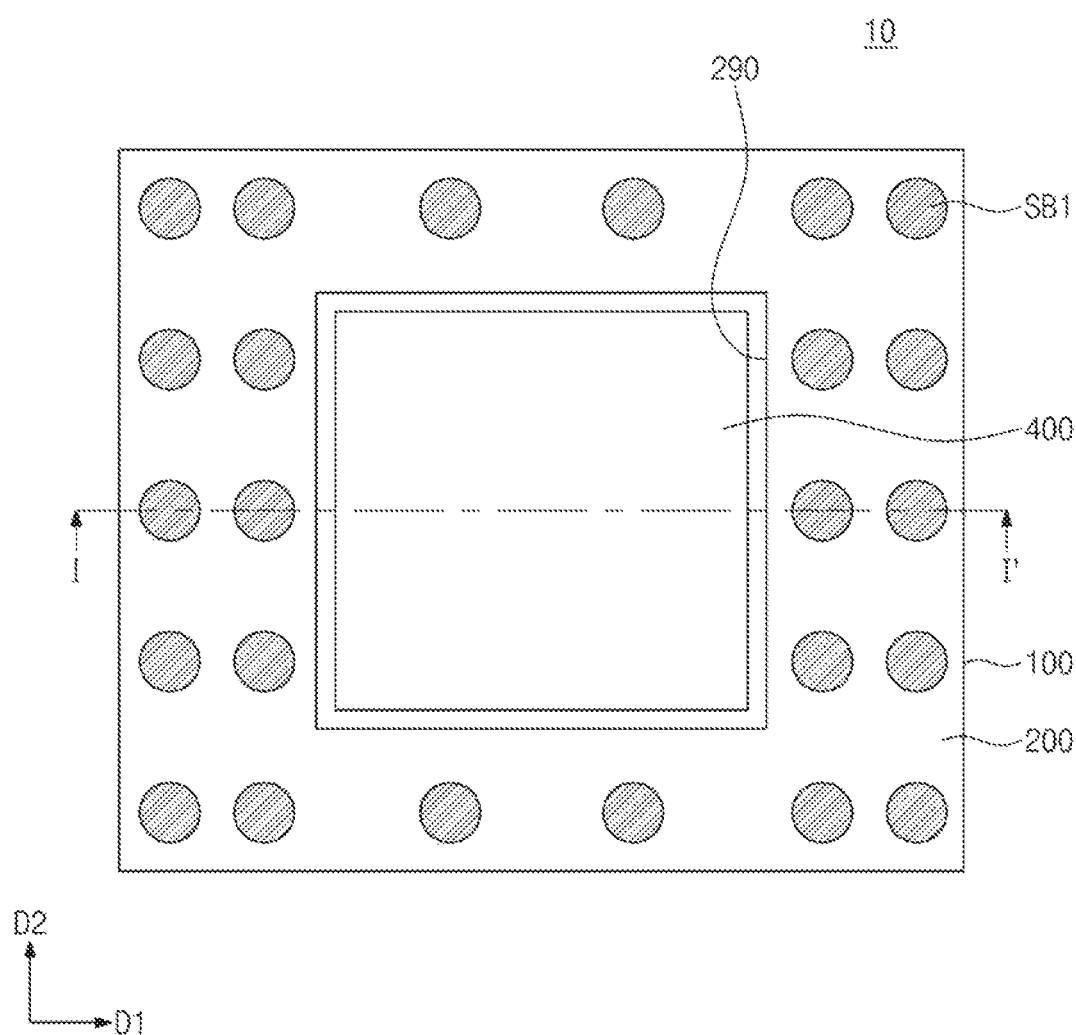
FIG. 1A is a plan view illustrating a package according to exemplary embodiments.

FIG. 1A is a plan view illustrating a first package 10 according to exemplary embodiments. FIGS. 1B to 1F, 1K and 1M are cross-sectional views for explaining a method of manufacturing a semiconductor package according to exemplary embodiments. FIGS. 1B to 1F, 1I, 1K and 1M correspond to cross-sectional views taken along line I-I' of FIG. 1A. FIGS. 1G and 1H are enlarged cross-sectional views of section II of FIG. 1F. FIGS. 1J, 1L, and IN are enlarged cross-sectional views of section II of FIGS. 1I, 1K, and 1M, respectively.

Figure 1B:
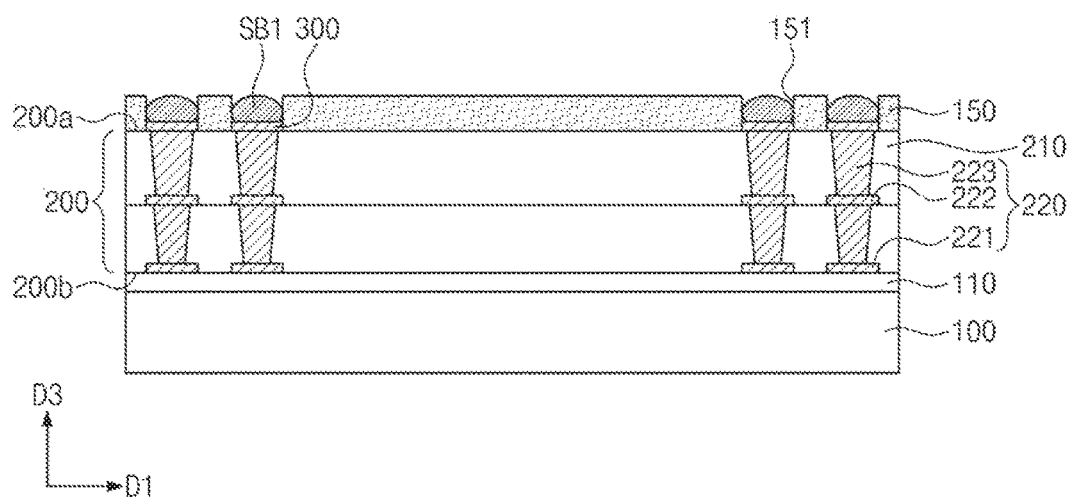
FIGS. 1B to 1F, 1I, 1K, and 1M, which correspond to cross-sectional views taken along line I-I' of FIG. 1A, are cross-sectional views for explaining a method of manufacturing a semiconductor package according to exemplary embodiments.

Referring to FIGS. 1A and 1B, an interconnect substrate 200 may be provided on a carrier substrate 100. A carrier glue layer 110 may be provided to adhere the interconnect substrate 200 onto the carrier substrate 100. For example, a printed circuit board (PCB) may be used as the interconnect substrate 200, which may be affixed to the carrier substrate 100 by the carrier glue layer 110. The interconnect substrate 200 may include base layers 210 and conductive members 220 in the base layers 210. The base layers 210 may include a non-conductive material (e.g., non-electrically conductive material). For example, the base layers 210 may include a carbon-containing material (e.g., graphite, graphene, etc.), a ceramic, or a polymer (e.g., nylon, polycarbonate, high-density polyethylene (HDPE), etc.). The conductive members 220 each may include a first pad 221, a line pattern 222, and vias 223. The first pad 221 may be disposed on a bottom surface 200b of the interconnect substrate 200 above the carrier glue layer 110. The vias 223 may penetrate the base layers 210. The line pattern 222 may be interposed between the base layers 210, and be connected to the vias 223. The conductive member 220 may include copper, nickel, aluminum, gold, silver, stainless steel, or an alloy thereof. The conductive member 220 may have a melting point of about 1100° C. In some embodiments, the conductive member 220 may have a melting point of more than about 450° C.

A solder pad 300 may be provided on a top surface 200a of the interconnect substrate 200, and may be electrically connected to one of the vias 223. The solder pad 300 may include copper, nickel, aluminum, gold, silver, stainless steel, or an alloy thereof. The solder pad 300 may have a high melting point. For example, the solder pad 300 may have a melting point of about 1100° C. In some embodiments, the solder pad 300 may have a melting point of more than about 450° C.

A mask pattern 150 may be formed on the top surface 200a of the interconnect substrate 200. The interconnect substrate 200 may include a mask opening 151 through which the solder pad 300 is exposed.

A solder bump, which may be, for example, a solder ball, such as first solder ball SB1, may be formed on the solder pad 300, and thus the first solder ball SB1 may be electrically connected to the conductive member 220. For example, a solder paste (not shown) may be provided on the solder pad 300 in the mask opening 151. The solder paste may be reflowed such that the first solder ball SB1 may be formed on the solder pad 300 in the mask opening 151. The first solder ball SB1 may be formed at a temperature less than the melting points of the conductive member 220 and the solder pad 300. For example, the first solder ball SB1 may be formed at a temperature of less than about 450° C. In some embodiments, the first solder ball SB1 may be formed at a temperature of from about 170° C. to about 230° C. The solder pad 300 may thus be in a solid state without being melted during the formation of the first solder ball SB1. The first solder ball SB1 may have a melting point of less than about 450° C. In some embodiments, the first solder ball SB1 may have a melting point of from about 170° C. to about 230° C. The first solder ball SB1 may include, for example, tin (Sn), lead (Pb), indium (In), or an alloy thereof. After reflowing the solder paste, the first solder ball SB1 may be placed at room temperature (e.g., about 15° C. to about 25° C.) and may be in a solid state. The mask pattern 150 may be removed.

Figure 1C:
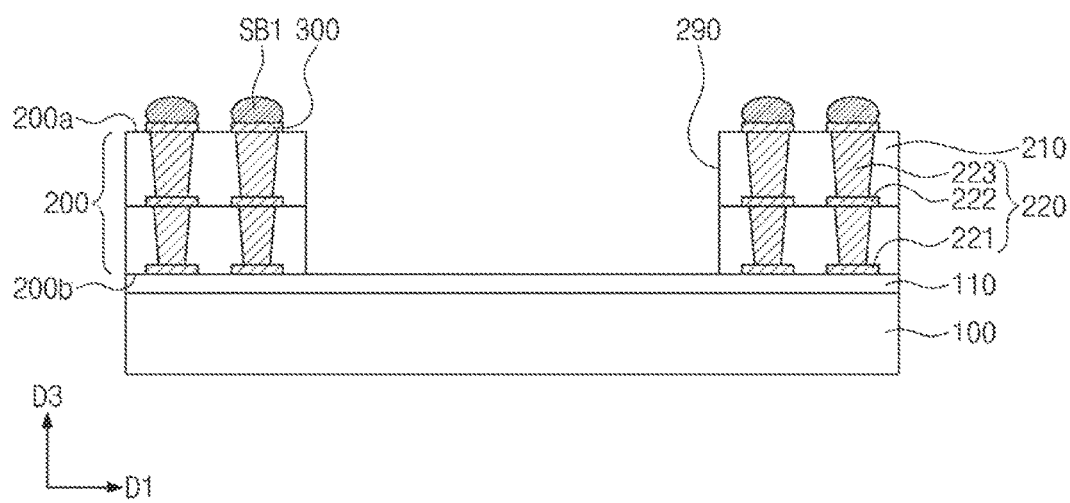

Referring to FIGS. 1A and 1C, a hole 290 may be formed in the interconnect substrate 200. For example, the interconnect substrate 200 may be partially removed to form the hole 290. As viewed in a plan view, the hole 290 may be formed on a central portion of the interconnect substrate 200.

Figure 1D:
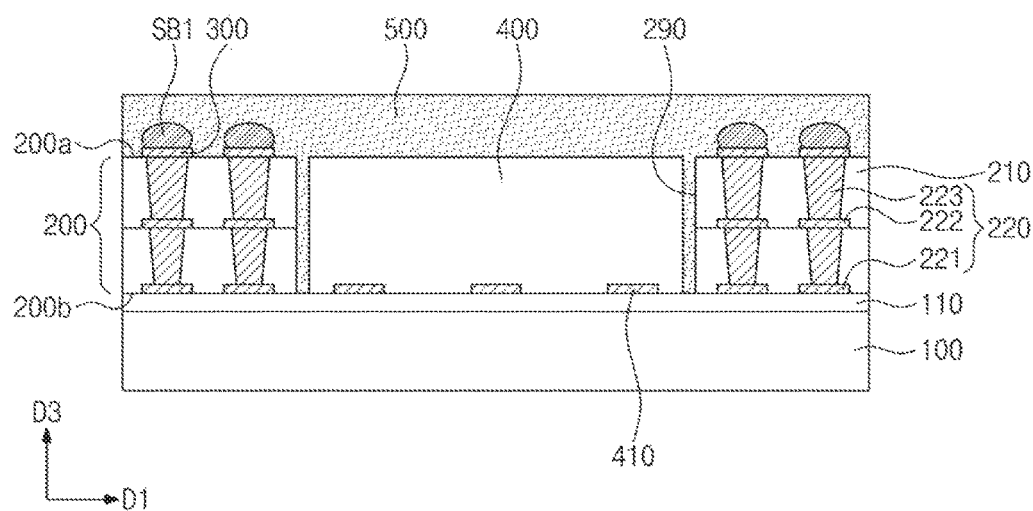

Referring to FIGS. 1A and 1D, a first semiconductor chip 400 and a first polymer layer 500 may be provided on the carrier substrate 100. The first semiconductor chip 400 may be provided in the hole 290 of the interconnect substrate 200 and may be, as viewed in a plan view, surrounded along its perimeter by the interconnect substrate 200. In some embodiments, there may be a gap between the semiconductor chip 400 and the surrounding interconnect substrate 200. The first semiconductor chip 400 may include one or more chip pads 410 on a bottom surface thereof.

The first polymer layer 500 may be formed on the interconnect substrate 200 and the first semiconductor chip 400. The first polymer layer 500 may cover first solder ball SB1. The first polymer layer 500 may be provided in a gap between the interconnect substrate 200 and the first semiconductor chip 400. The first polymer layer 500 may include an insulative polymer, such as, for example, an epoxy-based polymer. The first polymer layer 500 may serve as a molding layer. For example, a polymer sheet may be used to form the first polymer layer 500, but the embodiments are not limited thereto. Thereafter, the carrier substrate 100 and the carrier glue layer 110 may be removed to expose the bottom surface of the first semiconductor chip 400 and the bottom surface 200b of the interconnect substrate 200, as well as bottom surfaces of the first polymer layer 500 provided in the gap between the interconnect substrate 200 and the first semiconductor chip 400.

Figure 1E:
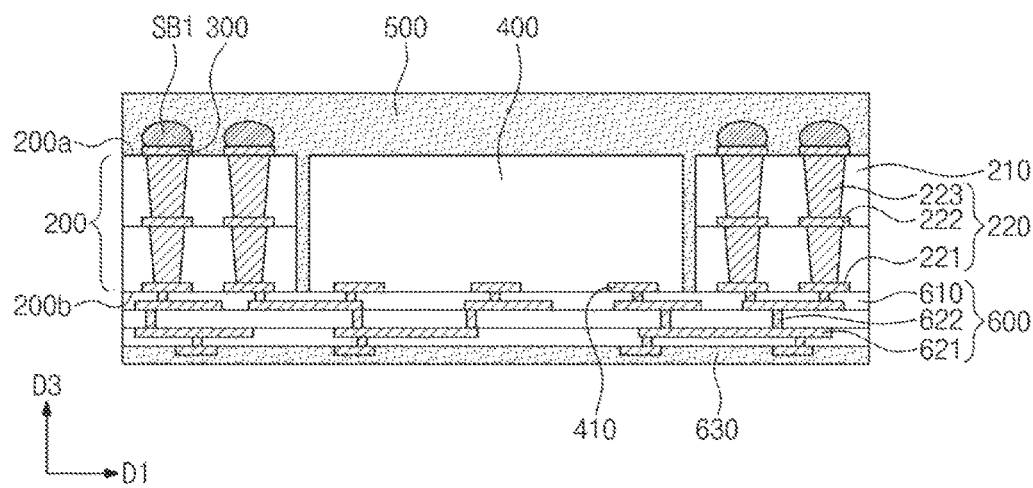

Referring to FIGS. 1A and 1E, insulation patterns 610 and redistribution members 621 and 622 may be formed on the bottom surface of the first semiconductor chip 400 and the bottom surface 200b of the interconnect substrate 200, thereby forming a first substrate 600. The first substrate 600 may be a redistribution substrate. The redistribution members 621 and 622 may include a conductive pattern 621 disposed between the insulation patterns 610 and a conductive via 622 penetrating the insulation patterns 610. The redistribution members 621 and 622 may include metal such as copper or aluminum, and may have a melting point of about 1100° C. In some embodiments, the redistribution members 621 and 622 may have a melting point of more than about 450° C. The redistribution members 621 and 622 may be in contact with the chip pad 410 of the first semiconductor chip 400 and the first pad 221 of the interconnect substrate 200. A protection layer 630 may be formed on a bottom surface of the first substrate 600. The protection layer 630 may include an insulative material. For example, the protection layer 630 may include the same material as the first polymer layer 500. Alternatively, the protection layer 630 may be omitted. In some embodiments, because a redistribution substrate is used as the first substrate 600, the first substrate 600 may have a small thickness.

Figure 1F:
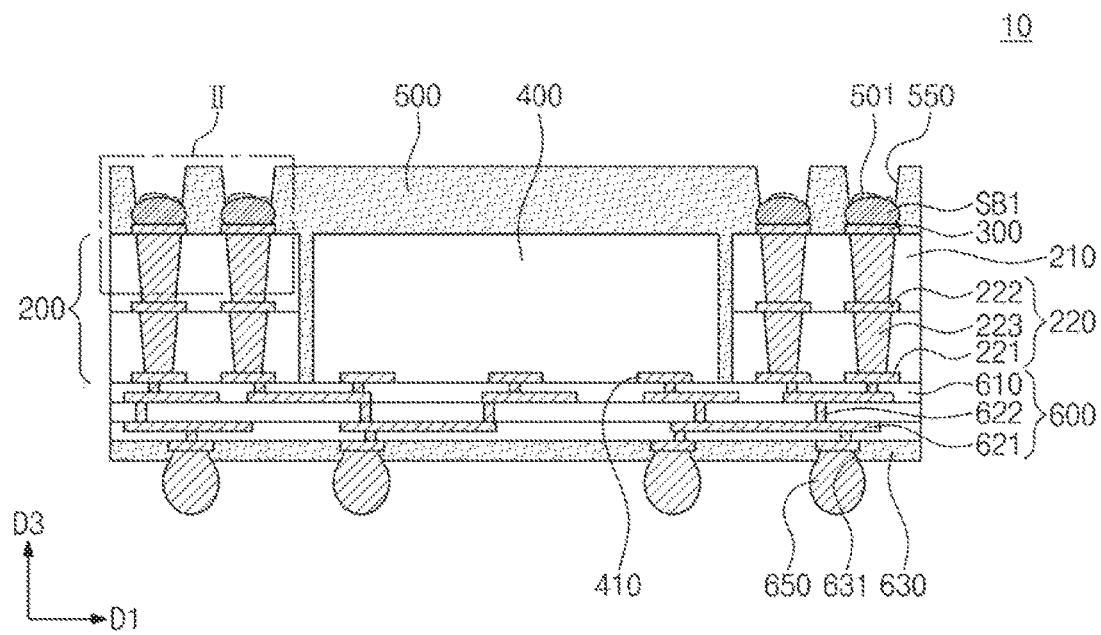
Figure 1G:
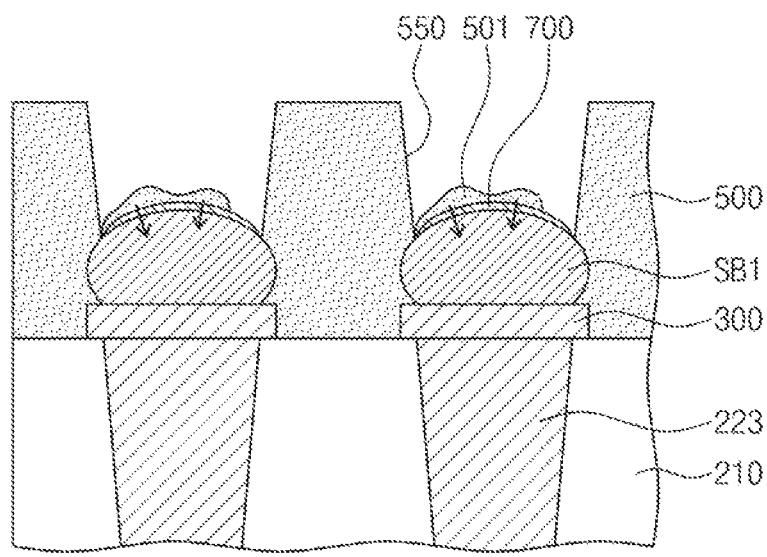
FIGS. 1G and 1H are cross-sectional views, corresponding to enlarged cross-sectional views of section II of FIG. 1F, illustrating a formation procedure of an opening according to exemplary embodiments.
Figure 1H:
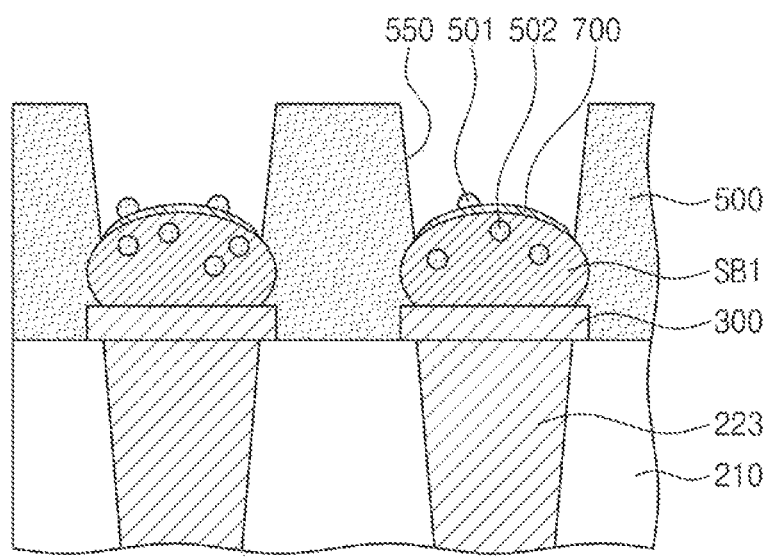

Referring to FIGS. 1A and 1F, an opening 550 may be formed in the first polymer layer 500 and thus the first solder ball SB1 may be exposed through the opening 550. In some embodiments, a portion of the first solder ball SB1 may be exposed through the opening 550 formed in the first polymer layer 500. For example, a drilling process may be performed to remove the first polymer layer 500 so that the opening 550 may be formed. In some embodiments, the drilling process may be performed using a laser drilling. Hereinafter, the formation of the opening 550 may be further discussed in detail with reference to FIGS. 1G and 1H. It should be noted that although only one opening 550 is discussed in this example, as shown in FIG. 1F, a plurality of openings may be formed.

FIGS. 1G and 1H are cross-sectional views, corresponding to enlarged cross-sectional views of section II of FIG. 1F, illustrating a formation procedure of an opening 550 according to exemplary embodiments.

Referring to FIG. 1G, the opening 550 may expose the first solder ball SB1 to air, and therefore an oxide layer 700 may be formed on the first solder ball SB1. The formation of the oxide layer 700 may be followed by the formation of the first polymer layer 500 of FIG. 1D or the formation of the oxide layer 700 may be preceded by the formation of the opening 550 of FIG. 1F. Although not illustrated, in some embodiments, the oxide layer 700 may be further interposed between the first solder ball SB1 and the first polymer layer 500. The oxide layer 700 may have various shapes and thicknesses, and is not limited to those illustrated. In the formation of the opening 550, a portion of the polymer 500 may not be removed but may remain to form a residue 501 on the first solder ball SB1. The residue 501 may be provided on the first solder ball SB1 and may cover the oxide layer 700. Alternatively, in some embodiments, the oxide layer 700 may not be interposed between the residue 501 and the first solder ball SB1. The residue 501 may have various shapes, and is not limited to that illustrated. The residue 501 may include the same material as the first polymer layer 500.

In the event that the formation of the opening 550 is followed by the formation of the first solder ball SB1 in FIG. 1F, the opening 550 may expose the solder pad 300, and a residue of the first polymer layer 500 may be provided on the solder pad 300. As the solder pad 300 has a high melting point, the solder pad 300 may not be melted by heat generated from the drilling process, but may remain in a solid state. The residue of the first polymer layer 500 may thus form a layer (not shown) covering the solder pad 300. In this example, the first solder ball SB1 may be formed on the residue of the first polymer layer 500. Since the formation of the first solder ball SB1 is performed at a temperature less than the melting point of the solder pad 300, the residue of the first polymer layer 500 may remain between the solder pad 300 and the first solder ball SB1. In such cases, poor electrical characteristics may be realized between the solder pad 300 and the first solder ball SB1. If a removal process is carried out to remove the residue of the first polymer layer 500 on the solder pad 300, it may increase the number of process steps for a semiconductor package. In addition, the solder pad 300 and/or the first polymer layer 500 may suffer from damage in the removal process for removing the residue of the first polymer layer 500.

In some embodiments, when the formation of the first solder ball SB1 is followed by the formation of the opening 550, the residue 501 may not be formed on the solder pad 300. The first solder ball SB1 may therefore be satisfactorily connected to the solder pad 300, allowing for a good electrical connection between the first solder ball SB1 and the solder pad 300.

Referring sequentially to FIGS. 1G and 1H, the drilling process may generate heat. The heat may be transmitted to the first solder ball SB1. As the first solder ball SB1 has a relatively low melting point, the heat may melt at least a portion of the first solder ball SB1. For example, an upper portion of the first solder ball SB1 may be melted into a liquid state. The residue 501 may flow into the first solder ball SB1 as designated by arrows in FIG. 1G, so that polymer particles 502 may be formed as shown in FIG. 1H. The oxide layer 700 may hardly affect the inflow of the residue 501, allowing the residue 501 to flow into the first solder ball SB1 substantially unimpeded. The polymer particles 502 may be dispersed in the first solder ball SB1. The polymer particles 502 may have various shapes such as, for example, a circle or an ellipse. For example, the polymer particles 502 may have an average diameter of less than about 2 µm. In some embodiments, the polymer particles 502 may have an average diameter less than about 1 µm. After the drilling process, the first solder ball SB1 may be placed at room temperature (e.g., about 15° C. to about 25° C.) and the melted portion of the first solder ball SB1 may change into a solid state. In some embodiments, the first solder ball SB1 may have thereon a portion of the residue 501 that does not inflow into the first solder ball SB1. Alternatively, in other embodiments, there may be no residue 501 remaining on the first solder ball SB1.

As illustrated in FIG. 1H, in some embodiments, the polymer particles 502 may be formed on the first solder ball SB1 and dispersed in the first solder ball SB1 when the opening 550 is formed. The polymer particles 502 dispersed in the first solder ball SB1 may be above a bottom of the first solder ball SB1. For example, at least some of the polymer particles 502 formed in the first solder ball SB1 may be located in a top half of the first solder ball SB1, and at least some of the polymer particles 502 may be located in a middle portion of the first solder ball SB1.

Returning to FIG. 1F, outer terminals 650 may be formed on the bottom surface of the first substrate 600. For example, lower openings 631 may be formed in the protection layer 630, and thus the redistribution members 621 and 622 may be exposed through the lower openings 631. The outer terminals 650 may be formed in the lower openings 631 and connected to the redistribution members 621 and 622. The outer terminals 650 may include metal and have a shape of solder ball. Each of the outer terminals 650 may be electrically connected to the first solder ball SB1 through the redistribution members 621 and 622 and the conductive member 220. The outer terminals 650 may not be aligned with the first solder ball SB1 in a third direction D3. For example, when viewed from a plan view (e.g., a third direction D3), the outer terminals 650 may be offset from the first solder ball SB1. The number of the outer terminals 650 may be different from the number of the solder pads 300. Through the aforementioned examples, a first package 10 may be fabricated. The first package 10 may be fabricated in a wafer level process.

Figure 1I:
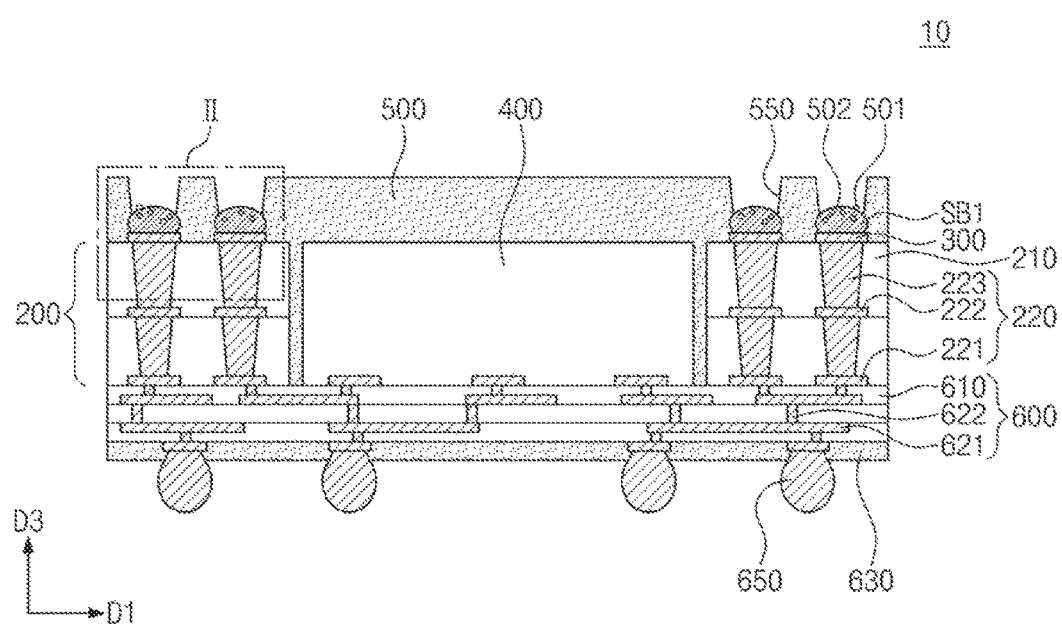
Figure 1J:
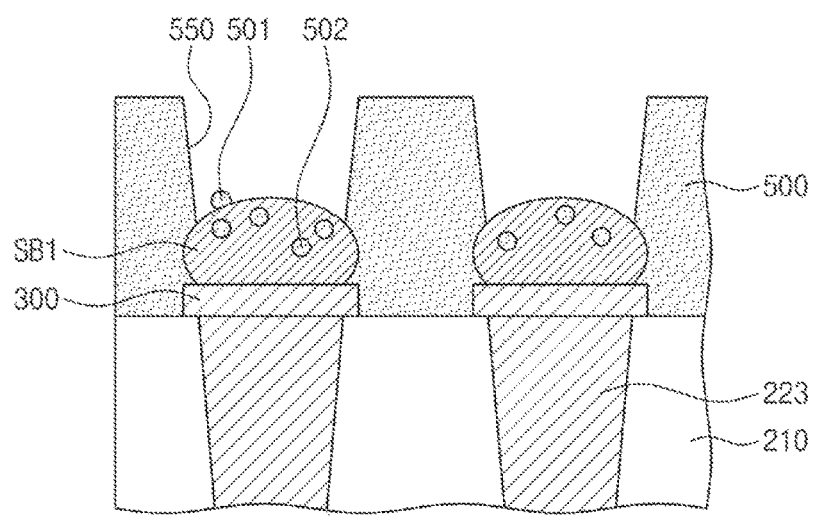
FIG. 1J is a cross-sectional view, corresponding to an enlarged cross-sectional view of section II of FIG. 1I, illustrating a formation procedure of an opening according to exemplary embodiments.

Referring to FIGS. 1A, 1I and 1J, the oxide layer 700 illustrated in FIGS. 1G and 1H may be removed by performing a cleaning process on the first solder ball SB1. The cleaning process may be performed using a flux solution. For example, the flux solution may include a halogen element. In this step, the residue 501 may also be removed together with the oxide layer 700. Since an individual process is not performed to remove the residue 501, it may be possible to simplify the fabrication of the first package 10. After the cleaning process is completed, in some embodiments, a portion of the residue 501 may not be removed but may remain on the first solder ball SB1. Alternatively, in other embodiments, there is no residue 501 remaining on the first solder ball SB1 when the cleaning process is terminated.

Figure 1K:
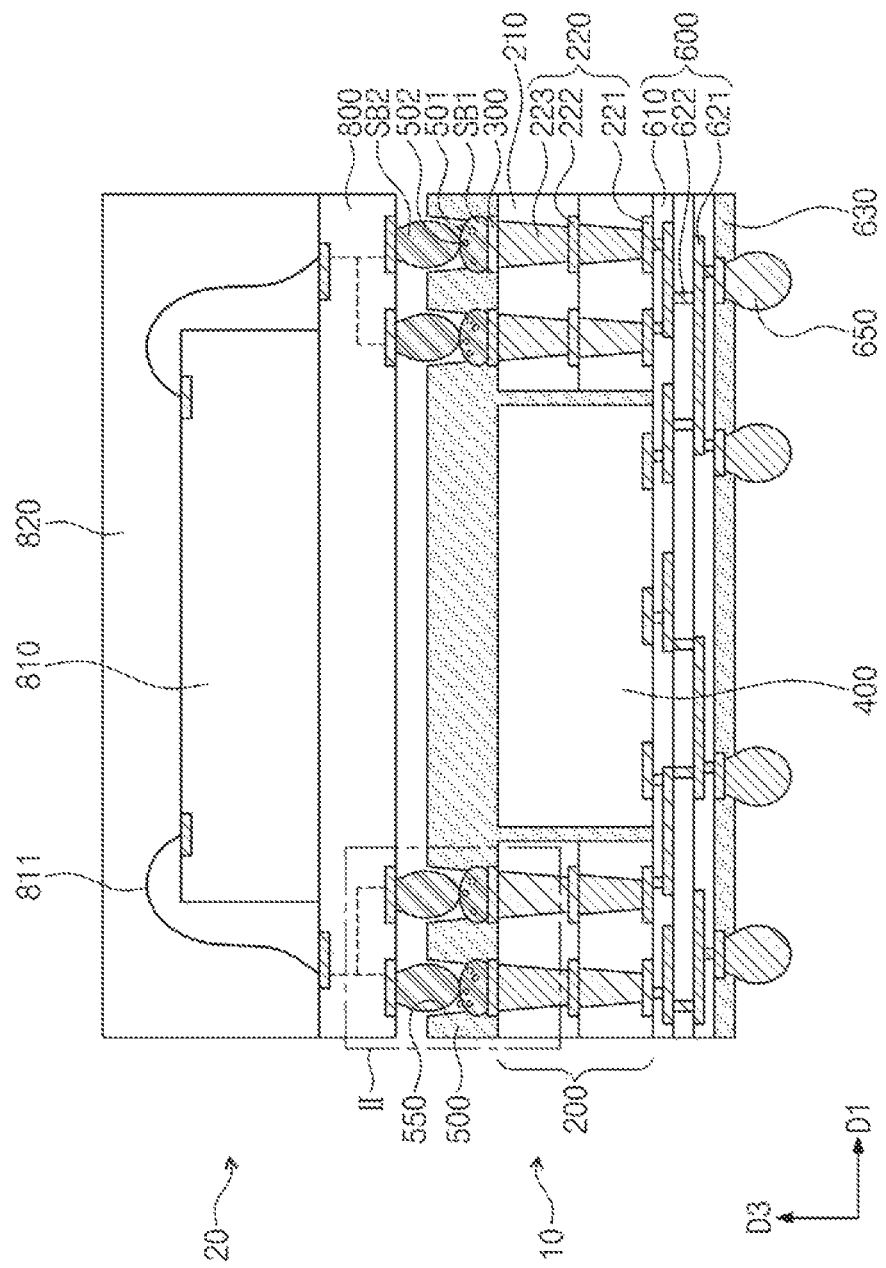
Figure 1L:
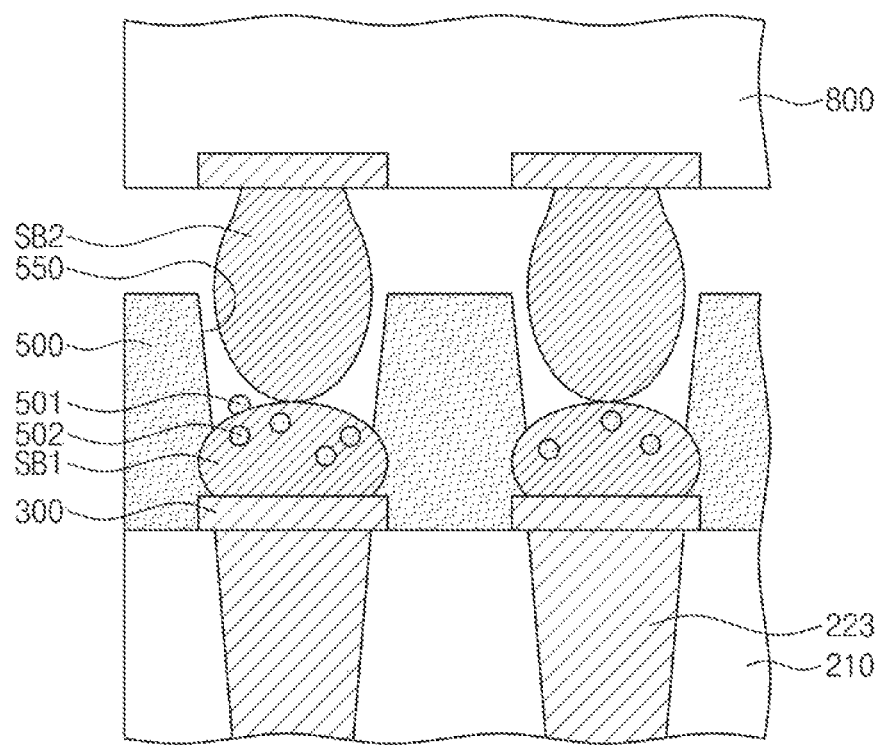
FIG. 1L is a cross-sectional view, corresponding to an enlarged cross-sectional view of section II of FIG. 1K, illustrating a formation procedure of an opening according to exemplary embodiments.

Referring to FIGS. 1K and 1L, a second package 20 may be provided on the first package 10. The second package 20 may include a second substrate 800, a second semiconductor chip 810, and a molding layer 820. The second substrate 800 may be a printed circuit board or a redistribution substrate. The second semiconductor chip 810 may be provided on the second substrate 800 and may be electrically connected to the second substrate 800 through, for example, a bonding wire 811. The second semiconductor chip 800 may have various numbers, mounting methods, arrangements, and constituent elements and/or features. A second solder ball SB2 may be provided on a bottom surface of the second substrate 800. The second solder ball SB2 may be electrically connected to the second semiconductor chip 810. A dashed line in the second substrate 800 may roughly denote an example of an electrical connection thereof. The second package 20 may be disposed on the first package 10 so as to align the second solder ball SB2 with the first solder ball SB1.

Figure 1M:
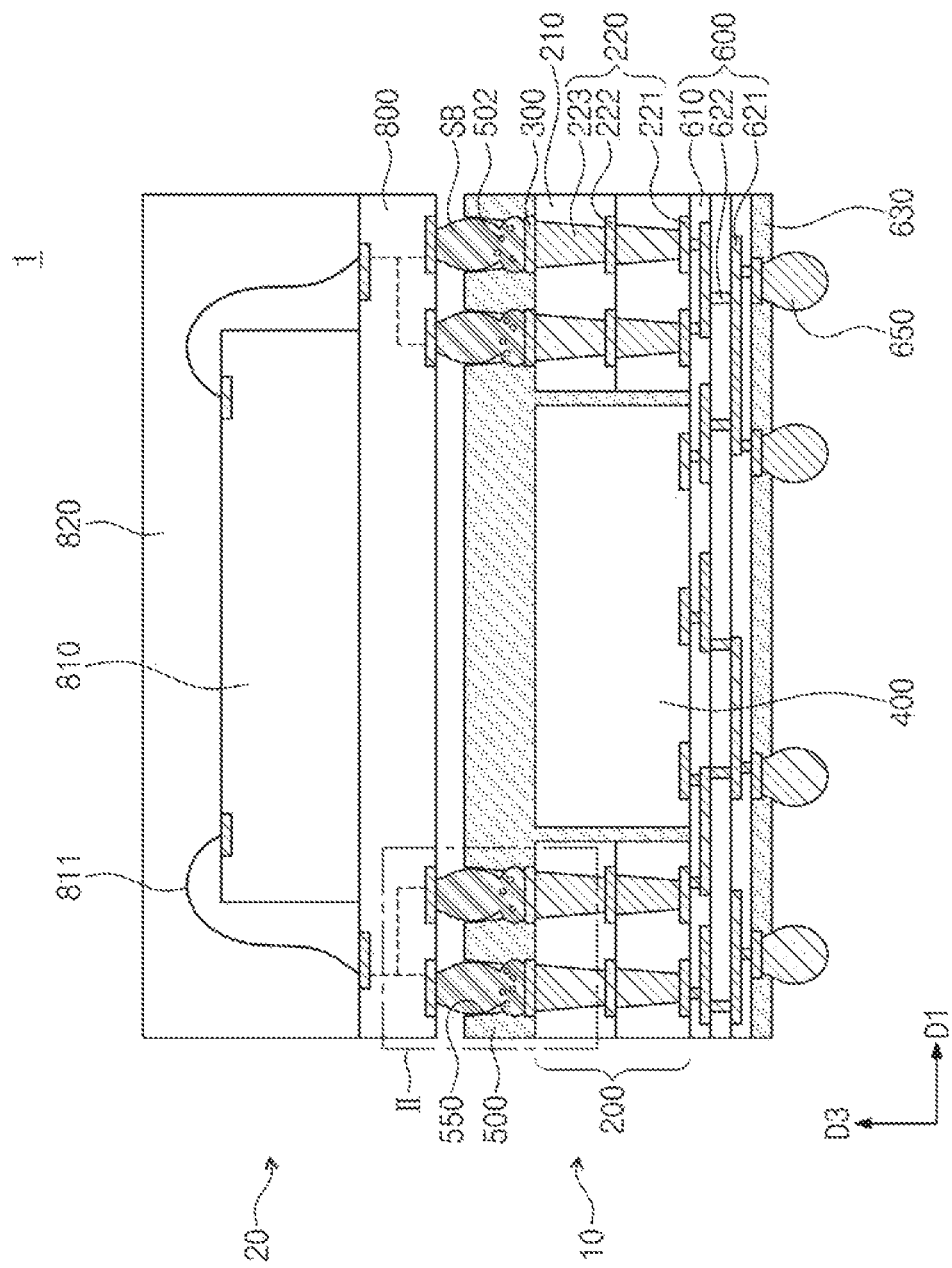
Figure 1N:
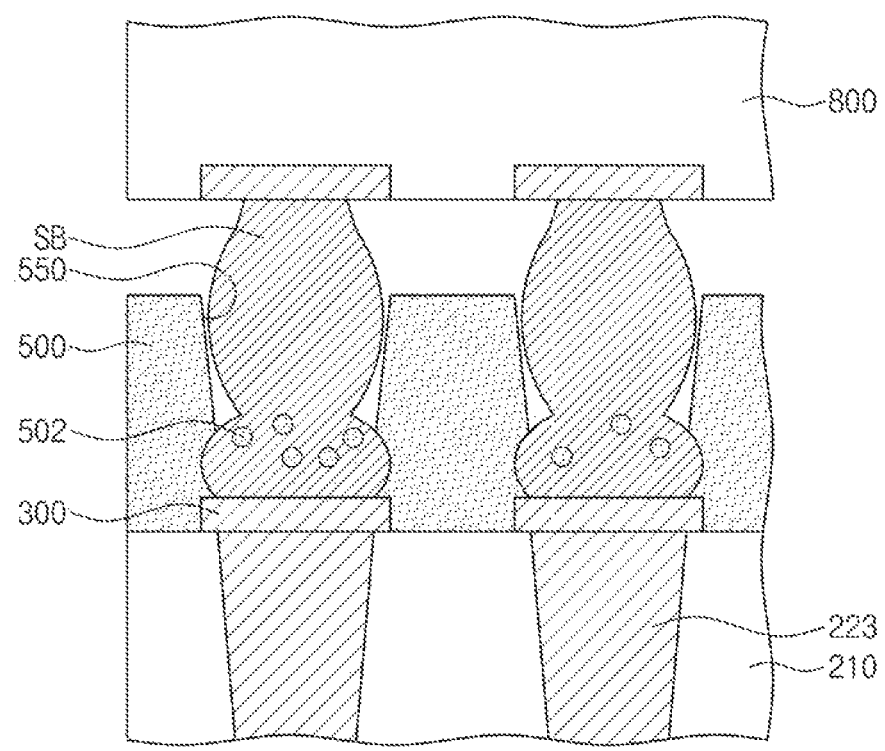
FIG. 1N is a cross-sectional view, corresponding to an enlarged view of section II of FIG. 1M, illustrating a formation procedure of an opening according to exemplary embodiments.

Referring to FIGS. 1M and 1N together with FIG. 1L, a reflow process may be performed to couple or join the second solder ball SB2 to the first solder ball SB1 so that an interconnect solder SB may be formed in a first semiconductor package 1. The interconnect solder SB may be formed between the solder pad 300 and the second substrate 800. The reflow process may be performed at a temperature equal to or greater than the melting points of the first and second solder balls SB1 and SB2 and less than the melting points of the conductive members 220 and the solder pad 300. For example, the reflow process may be performed at a temperature of less than about 450° C. In some embodiments, the reflow process may be performed at a temperature of from 170° C. to about 230° C. The conductive member 220 and the solder pad 300 may not be melted in the reflow process, but may remain in a solid form. The conductive member 220 and the solder pad 300 may not suffer from damage in the reflow process.

Although a portion of the residue 501 remains on the first solder ball SB1 in the reflow process, the residue 501 may flow into the interconnect solder SB as shown in FIGS. 1G and 1L and polymer particles 502 may be formed in the interconnect solder SB as shown in FIGS. 1M and 1N. The polymer particles 502 may be dispersed in the interconnect solder SB, so that the polymer particles 502 may hardly affect electrical characteristics of the interconnect solder SB. Accordingly, the second package 20 may be satisfactorily electrically connected to the first package 10 through the interconnect solder SB. A first semiconductor package 1 may have an enhanced reliability. In some embodiments, the cleaning process of FIGS. 1I and 1J may be performed prior to the reflow process, and the remaining residue 501 may be advantageously reduced in the reflow process. Therefore, the second solder ball SB2 may be satisfactorily connected to the first solder ball SB1 and the first semiconductor package 1 may have much enhanced reliability.

Figure 2A:
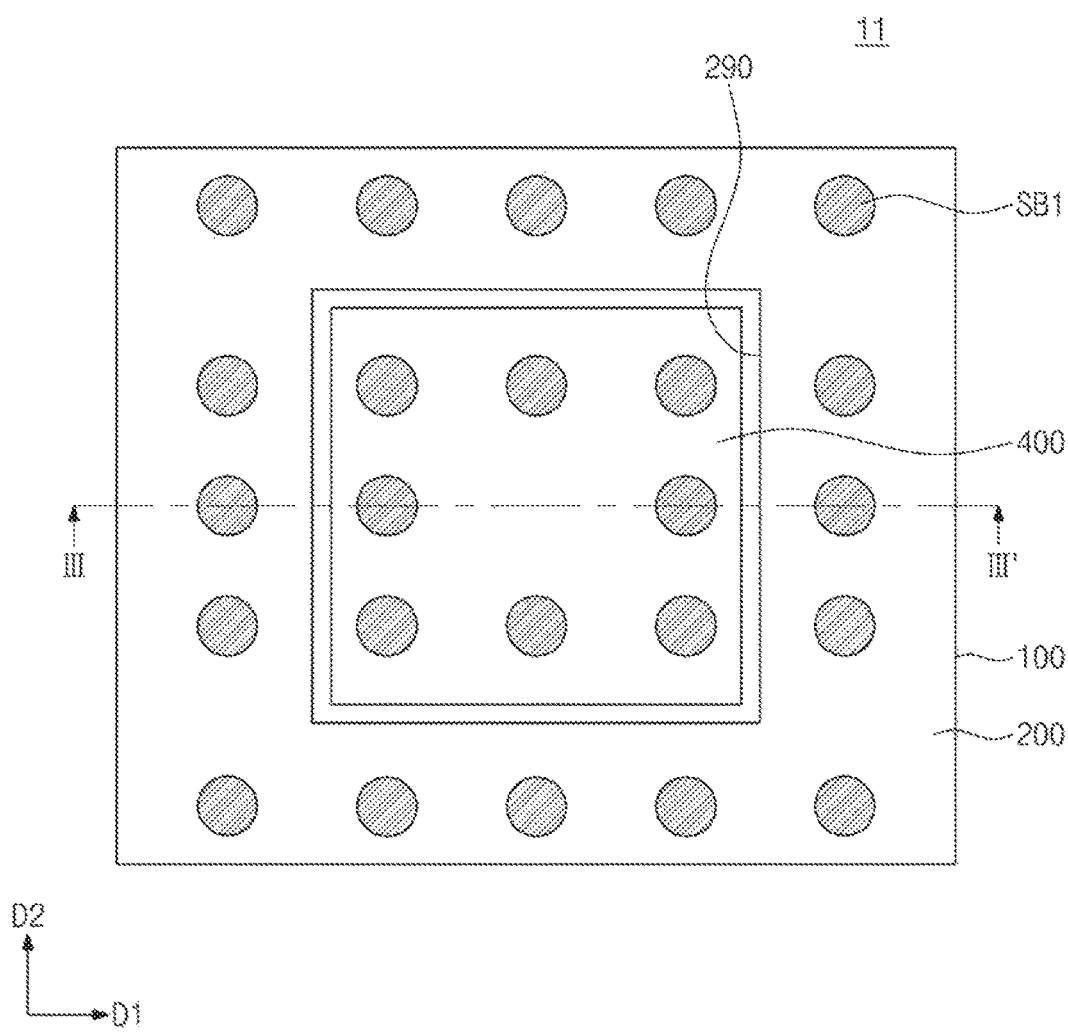
FIG. 2A is a plan view illustrating a first package according to exemplary embodiments.

FIG. 2A is a plan view illustrating a first package according to exemplary embodiments. FIGS. 2B to 2H are cross-sectional views for explaining a method of manufacturing a semiconductor package according to exemplary embodiments. FIGS. 2B to 2E correspond to cross-sectional views taken along line of FIG. 1A. Descriptions duplicative to the aforementioned will be hereinafter omitted.

Figure 2B:
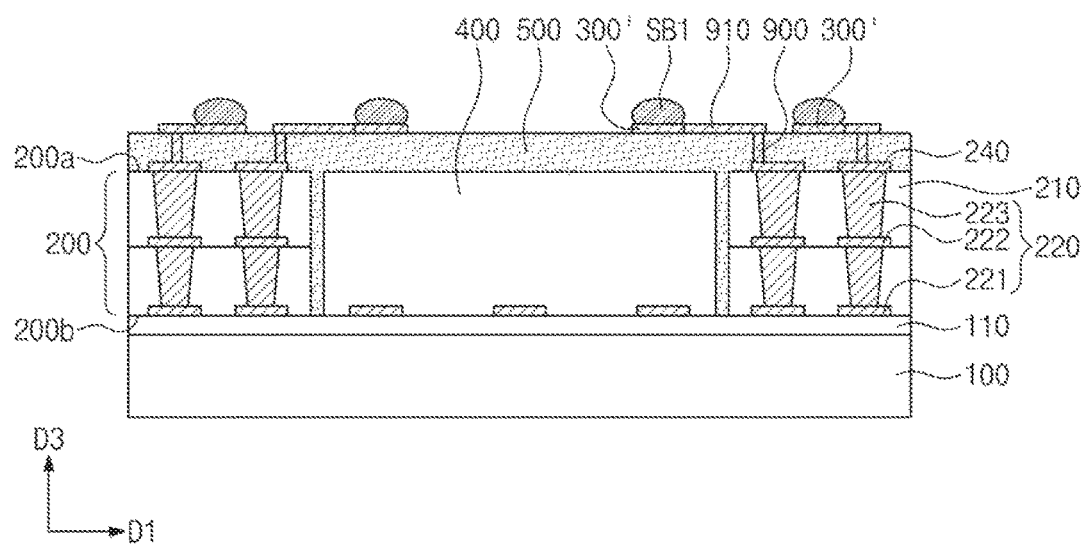
FIGS. 2B to 2H are cross-sectional views for explaining a method of manufacturing a semiconductor package according to exemplary embodiments.

Referring to FIGS. 2A and 2B, the interconnect substrate 200, the first semiconductor chip 400, and the first polymer layer 500 may be provided on the carrier substrate 100. Descriptions provided with reference to FIGS. 1B to 1D may also be applicable to form the interconnect substrate 200, the first semiconductor chip 400, and the first polymer layer 500. A plurality of second pads 240 may be provided on the top surface 200a of the interconnect substrate 200, and may be electrically connected to the vias 223. The first polymer layer 500 may be formed on the interconnect substrate 200 and the first semiconductor chip 400.

Interconnect vias 900 may be formed in the first polymer layer 500. The interconnect vias 900 may be disposed on and connected to the second pads 240. For example, each of the second pads 240 may be connected to a corresponding one of the interconnect vias 900. The interconnect vias 900 may include copper, nickel, aluminum, gold, silver, stainless steel, or an alloy thereof. The interconnect vias 900 may have a melting point of about 1100° C. In some embodiments, the interconnect vias 900 may have a melting point of more than about 450° C.

Interconnect patterns 910 and a plurality of solder pads 300' may be formed on the first polymer layer 500. The interconnect patterns 910 may extend along a top surface of the first polymer layer 500 and be electrically connected to the interconnect vias 900 and the solder pads 300'. The solder pads 300' may be electrically connected to the interconnect vias 900 through the interconnect patterns 910. At least one of the solder pads 300' may not be aligned with its connected conductive member 220 in the third direction D3. The bottom surface 200b of the interconnect substrate 200 may be parallel to the first and second directions D1 and D2, which may be crossed and perpendicular to each other. The third direction D3 may be perpendicular to the first and second directions D1 and D2. The solder pads 300' may be formed on the first semiconductor chip 400 as well as on the interconnect substrate 200. As the interconnect patterns 910 are provided, the solder pads 300' may have increased degree of freedom of arrangement. For example, the provision of the interconnect patterns 910 may allow for a variety of arrangements of the solder pads 300'. The solder pads 300' and the interconnect patterns 910 may include copper, nickel, aluminum, gold, silver, stainless steel, or an alloy thereof. The solder pads 300' and the interconnect patterns 910 each may have a melting point of about 1000° C. In some embodiments, the solder pads 300' and the interconnect patterns 910 each may have a melting point of more than about 450° C.

The first solder ball SB1 may be provided in plural (i.e., plural first solder balls SB1). The first solder balls SB1 may be formed on the solder pads 300'. The first solder balls SB1 may be formed by a process substantially the same as that discussed in connect in with FIG. 1B. The first solder balls SB1 may have a melting point and a material the same as those of the embodiment discussed in FIG. 1B. The first solder balls SB1 may be electrically connected to the solder pads 300'. For example, each of the first solder balls SB1 may be electrically connected to a corresponding one of the solder pads 300'. The first solder balls SB1 may be formed on the first semiconductor chip 400 as well as on the interconnect substrate 200.

Figure 2C:
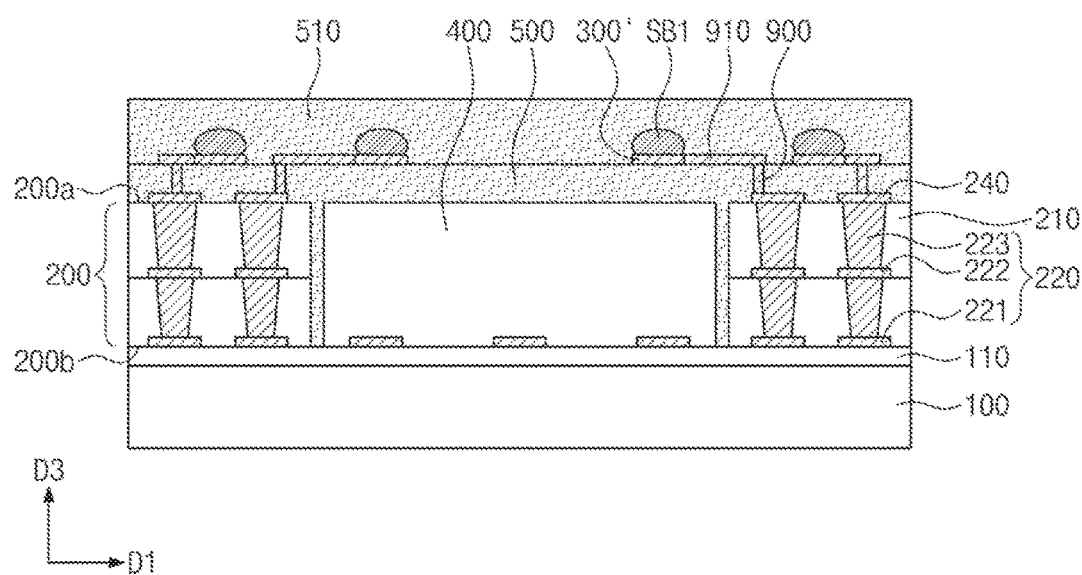

Referring to FIGS. 2A and 2C, a second polymer layer 510 may be formed on the first polymer layer 500 and may cover the first solder balls SB1 and the interconnect patterns 910. The second polymer layer 510 may include an insulative polymer, such as, for example, an epoxy-based polymer. The second polymer layer 510 may be a molding layer, but the second polymer layer 510 may not be limited thereto. Thereafter, the carrier substrate 100 and the carrier glue layer 110 may be removed to expose the bottom surface of the first semiconductor substrate 400 and the bottom surface 200b of the interconnect substrate 200.

Figure 2D:
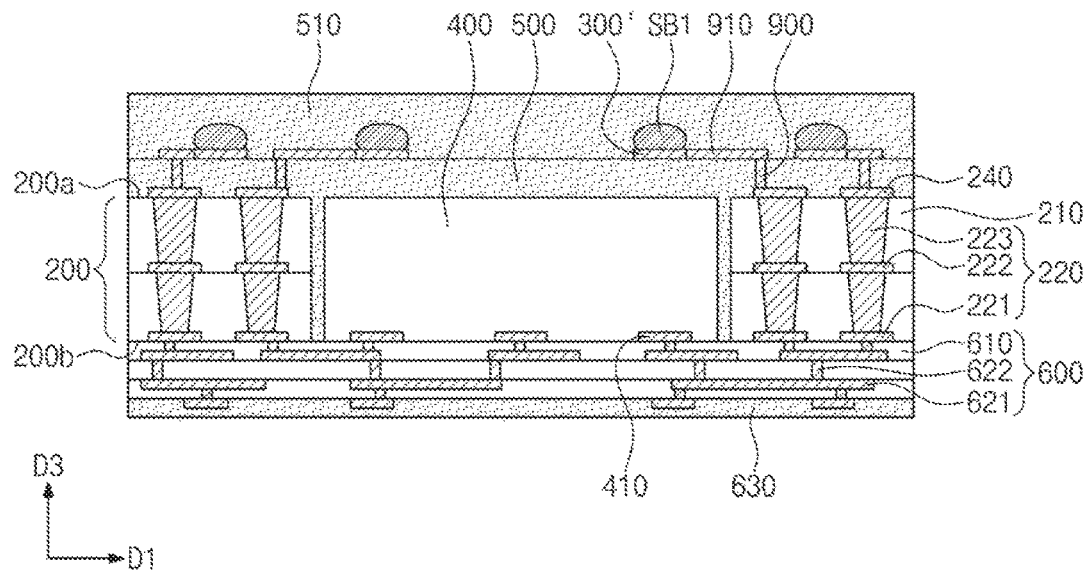

Referring to FIGS. 2A and 2D, the insulation patterns 610 and the redistribution members 621 and 622 may be formed on the bottom surface of the first semiconductor substrate 400 and the bottom surface 200b of the interconnect substrate 200, thereby forming the first substrate 600. In some embodiments, the protection layer 630 may be formed on the bottom surface of the first substrate 600. Alternatively, in other embodiments, the protection layer 630 may not be formed.

Figure 2E:
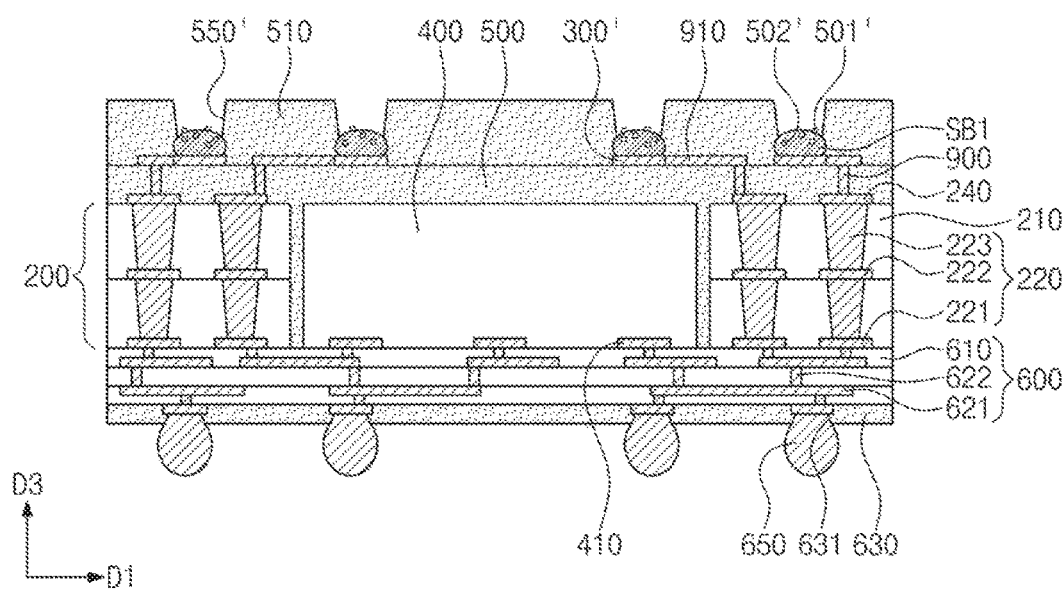

Referring to FIGS. 2A and 2E together with FIGS. 1G and 1H, a drilling process (e.g., a laser drilling) may be performed to form a plurality of openings 550' in the second polymer layer 510. The openings 550' may respectively expose the first solder balls SB1. For example, each of the openings 550' may expose a portion of a corresponding one of the first solder balls SB1. When the second polymer layer 510 is removed, residues 501' of the second polymer layer 510 may be formed on the first solder balls SB1. The first solder balls SB1 may be melted by heat generated from the drilling process, and the residues 501' may flow into the first solder balls SB1 to form polymer particles 502'. After the drilling process, portions of the residues 501' may remain on the first solder balls SB1. The outer terminals 650 may be formed on the bottom surface of the first substrate 600 and therefore a first package 11 may be fabricated.

Figure 2F:
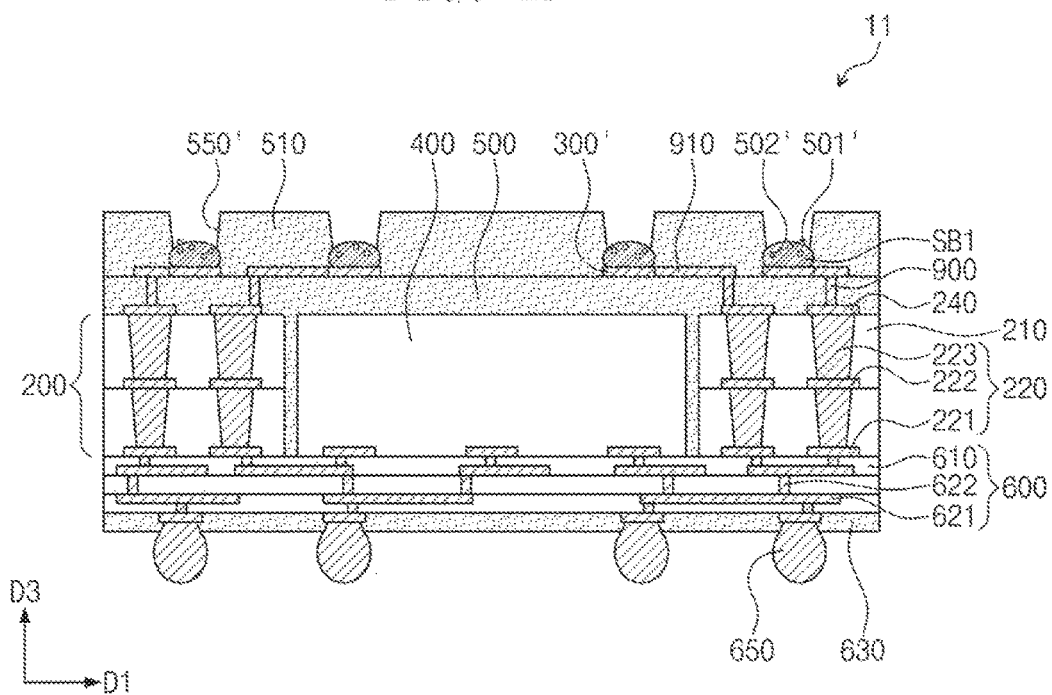

Referring to FIGS. 2A and 2F together with FIG. 1J, the residues 501' may be removed by performing a cleaning process on the first solder balls SB1. In this step, the oxide layer 700 of FIG. 1H of the first solder ball SB1 may be removed together with the residues 501'. Portions of the residues 501' may not be removed but remain on the first solder balls SB1.

Figure 2G:
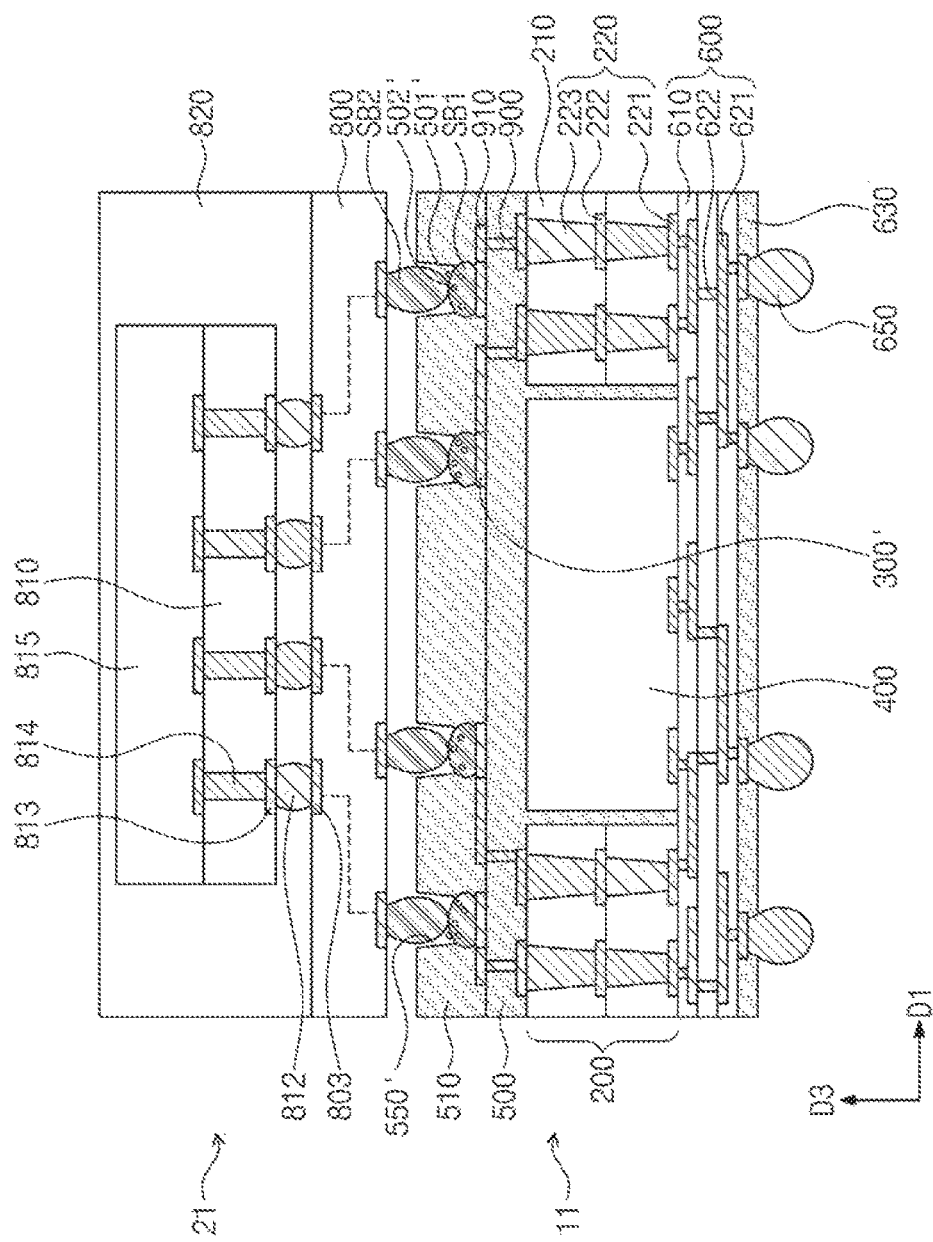

Referring to FIGS. 2A and 2G, a second package 21 may be disposed on the first package 11 so as to align the second solder balls SB2 with the first solder balls SB1. As the first solder balls SB1 are disposed on the first semiconductor chip 400, the second solder balls SB2 and a circuit pattern (not shown) in the second substrate 800 may have increased degree of freedom of arrangement.

In some embodiments, a bump 812 may be provided to mount the second semiconductor chip 810 on the second substrate 800 in a flip-chip manner. Alternatively, in other embodiments, the second semiconductor chip 810 may be directly bonded onto the second substrate 800. For example, the bump 812 may be omitted such that chip pads 813 of the second semiconductor chip 810 may contact pads 803 disposed on a top surface of the second substrate 800. A third semiconductor chip 815 may be stacked on the second semiconductor chip 810 and may be electrically connected to the second substrate 800 by through vias 814 formed in the second semiconductor chip 810. The number, arrangement, and mounting methods of the semiconductor chips 810 and 815 may be variously changed.

Figure 2H:
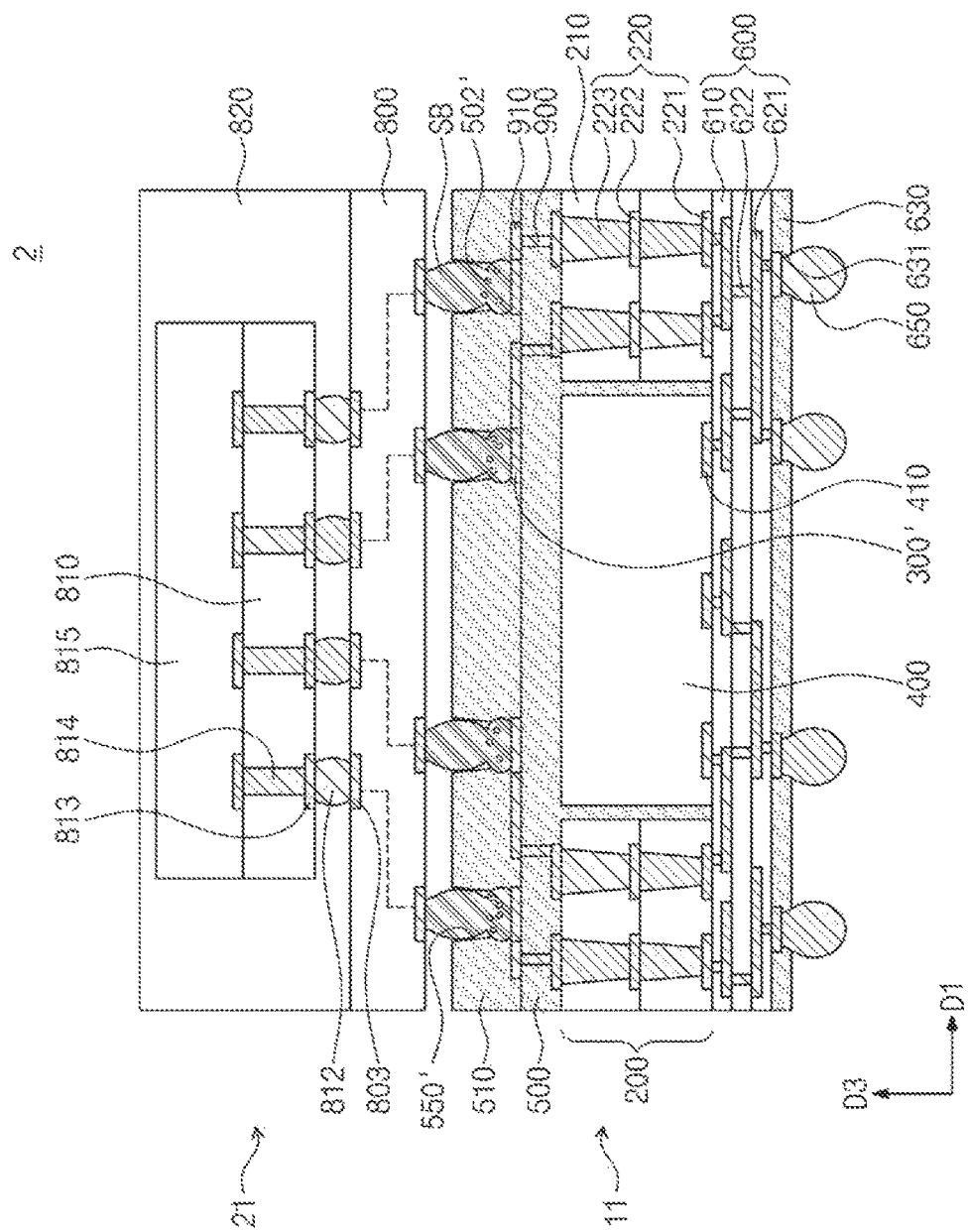

Referring to FIGS. 2A and 2H, a reflow process may be performed to couple the second solder balls SB2 to the first solder balls SB1 so that a plurality of the interconnect solders SB may be formed. Although the residues 501' of FIG. 2F partially remain on the first solder balls SB1, the residues 501' may flow into the interconnect solders SB in the reflow process and thus polymer particles 502' may be formed in the interconnect solders SB as discussed in connection with FIG. 1N. As the polymer particles 502' are dispersed in the interconnect solders SB, the polymer particles 502' may not deteriorate electrical characteristics of a semiconductor package 2.

Figure 3A:
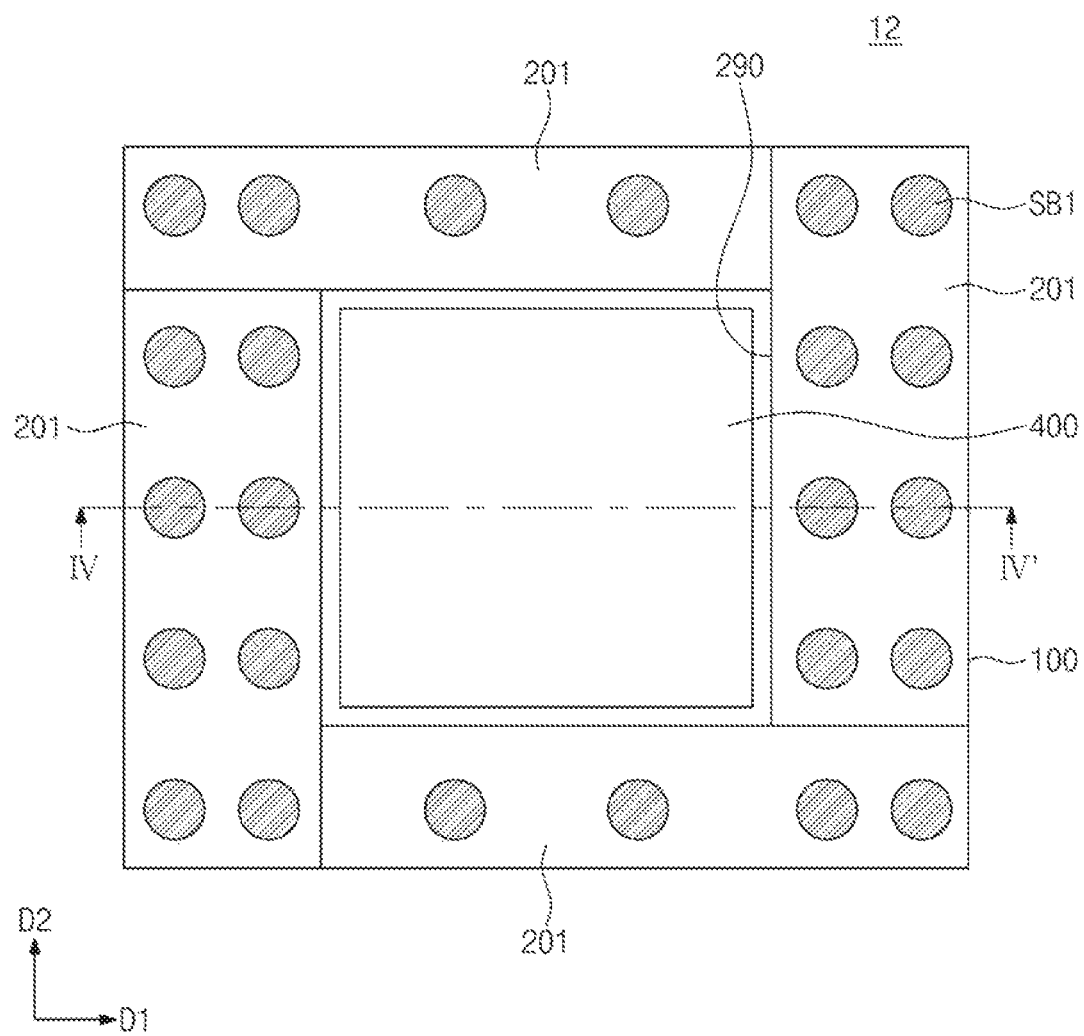
FIG. 3A is a plan view illustrating a package according to exemplary embodiments.
Figure 3B:
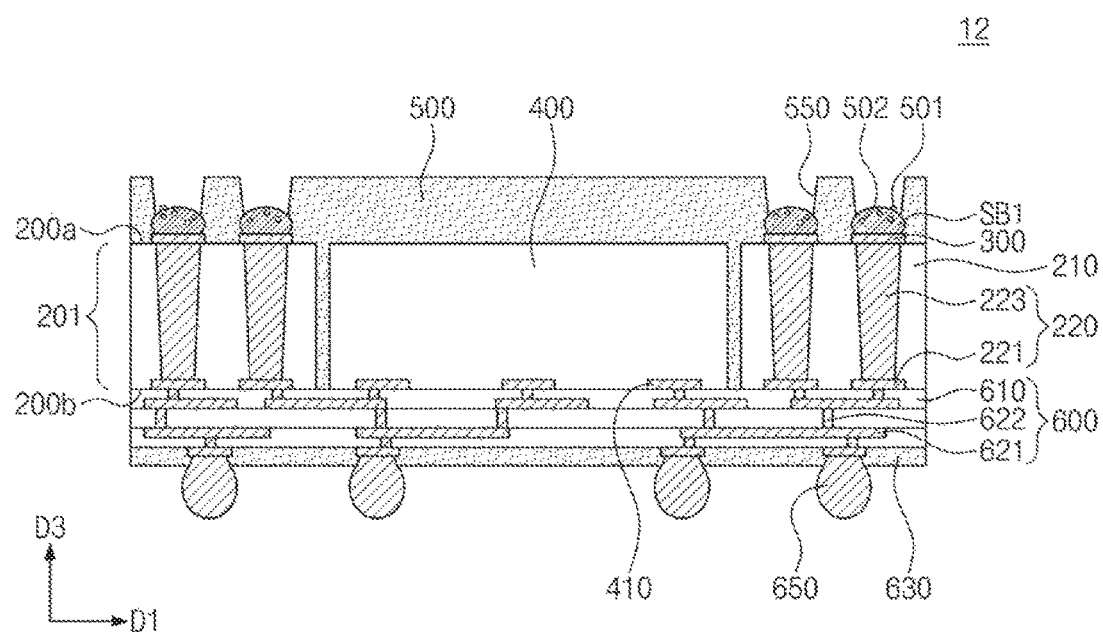
FIG. 3B is a cross-sectional view taken along line IV-IV' of FIG. 3A.

FIG. 3A is a plan view illustrating a first package according to exemplary embodiments. FIG. 3B is a cross-sectional view taken along line IV-IV' of FIG. 3A.

Referring to FIGS. 3A and 3B, a first package 12 may include the first substrate 600, the first semiconductor chip 400, the first polymer layer 500, the solder pads 300, and first solder balls SB1. The first package 12 may further include an interconnect substrate 201 whose structural feature is different from that of the interconnect substrate 200 discussed with reference to FIGS. 1A and 1F. The interconnect substrate 201 will be discussed in detail later. Explanations with reference to FIGS. 1B to 1F may also be substantially identically applicable to form the first substrate 600, the first semiconductor chip 400, the solder pads 300, and the first solder balls SB1.

The interconnect substrate 201 may be provided in plural (e.g., plural interconnect substrates 201). As shown in FIG. 3A, the interconnect substrates 201 may surround the first semiconductor chip 400. As shown in FIG. 3B, each of the interconnect substrates 201 may include the base layer 210 and the conductive members 220. Differently from the interconnect substrate 200 described in connection with FIGS. 1A and 1F, in some embodiments, the base layer 210 may be provided in single (e.g., one base layer 210) and the line patterns 222 may be omitted. The vias 223 may penetrate the base layer 210 and may contact respectively the first pads 221 and the solder pads 300. For example, each of the vias 223 may be in direct contact with a corresponding one of the first pads 221 and a corresponding one of the solder pads 300.

The polymer particles 502 may be formed in the first solder balls SB1. As discussed in FIG. 1H, the polymer particles 502 may be residues of the first polymer layer 500 that are formed when the openings 550 are formed. The polymer particles 502 may include the same material as the first polymer layer 500. In some embodiments, the residue 501 may be provided on the solder balls SB1. Alternatively, in other embodiments, the residue 501 may not be provided.

Figure 3C:
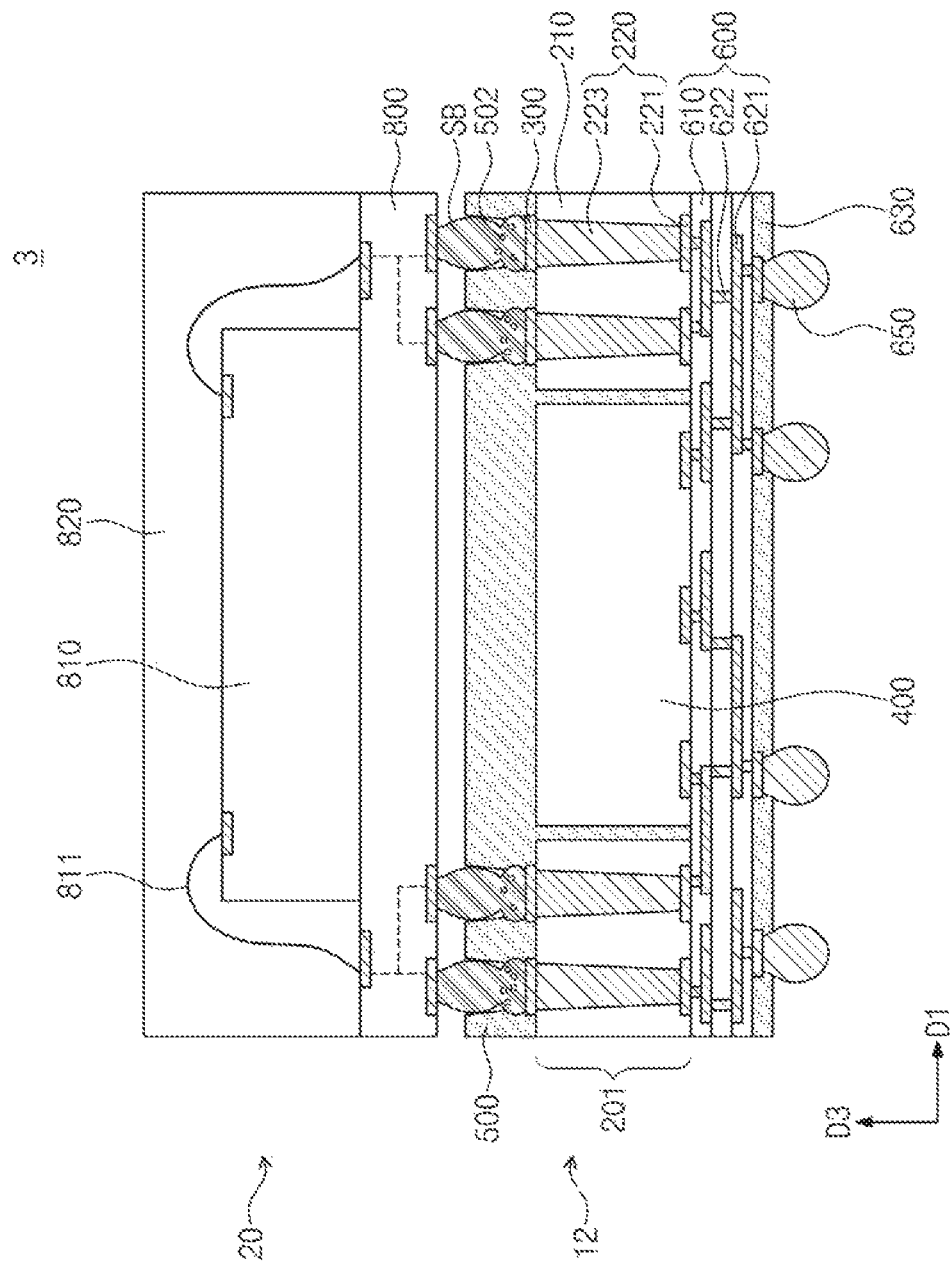
FIG. 3C is a cross-sectional view illustrating a semiconductor package according to exemplary embodiments.

FIG. 3C is a cross-sectional view illustrating a semiconductor package according to exemplary embodiments. Descriptions duplicate with the aforementioned will be hereinafter omitted.

Referring to FIG. 3C, a semiconductor package 3 may be manufactured by mounting the second package 20 on the first package 12 of FIGS. 3A and 3B. The second package 20 may be mounted on the first package 12 by methods substantially the same as those discussed in connection with FIGS. 1K and 1N. For example, a reflow process may be performed to couple or join the second solder balls SB2 to the first solder balls SB1 so that the interconnect solders SB may be formed. Prior to the mounting of the second package 20 on the first package 12, a cleaning process may be performed on the first solder balls SB1 to remove the residue 501.

According to the certain disclosed embodiments, the first solder ball may be formed before the opening is formed in the polymer layer. Due to the low melting point of the first solder ball, the residue of the polymer layer may flow into the first solder ball in the formation of the opening such that the polymer particles may be formed. The residue of the polymer layer may further flow into the first solder ball or the interconnect solder in the reflow process. The polymer particles may be dispersed in the first solder ball. Therefore, the polymer particles may have a minimal affect on the electrical characteristics of the first solder ball or the interconnect solder. A cleaning process may be performed on the first solder ball to effectively remove the residue of the polymer layer. The semiconductor may thus have an enhanced reliability.

Although the present concepts have been described in connection with the embodiments illustrated in the accompanying drawings, it is not limited thereto. It will be apparent to those skilled in the art that various substitution, modifications and changes may be thereto without departing from the scope and spirit of the invention.

What is claimed is:

1. A method of manufacturing a semiconductor package, the method comprising:
   providing an interconnect substrate on a carrier substrate;
   forming a first solder ball on a top surface of the interconnect substrate;
   providing a semiconductor chip on the carrier substrate, the semiconductor chip being surrounded by and spaced apart from the interconnect substrate in a plan view;
   forming a polymer layer on the top surface of the interconnect substrate and on a top surface of the semiconductor chip, the polymer layer covering the first solder ball and the top surface of the semiconductor chip;
   forming an opening in the polymer layer to expose the first solder ball,
   removing the carrier substrate to expose a bottom surface of the semiconductor chip and a bottom surface of the interconnect substrate; and
   forming a redistribution substrate on the bottom surface of the semiconductor chip and the bottom surface of the interconnect substrate,
   wherein the top surface of the interconnect substrate is disposed at a higher vertical level than the bottom surface of the semiconductor chip.

2. The method of claim 1, further comprising:
   forming a solder pad on the interconnect substrate,
   wherein the first solder ball is disposed on and contacts the solder pad, and
   wherein a melting point of the first solder ball is less than a melting point of the solder pad.

3. The method of claim 1, further comprising:
   forming polymer particles in the first solder ball,
   wherein the polymer particles comprise the same material as the polymer layer.

4. The method of claim 3, wherein the polymer particles are formed when the opening is formed.

5. The method of claim 1, wherein forming the opening comprises:
   removing a portion of the polymer layer by a laser drilling.

6. The method of claim 1, further comprising:
   providing a second package including a second solder ball on a bottom surface thereof; and
   reflowing the first solder ball and the second solder ball.

7. The method of claim 6, wherein a residue of the polymer layer is provided on the first solder ball when the opening is formed,
   wherein the method further comprises performing a cleaning process using a flux solution on the first solder ball to remove the residue of the polymer layer before the reflowing.

8. The method of claim 1, wherein the providing the interconnect substrate comprises:
   providing at least one base layer and a conductive member in the at least one base layer,
   wherein the first solder ball is electrically connected to the conductive member.

9. A method of manufacturing a semiconductor package, the method comprising:
   providing an interconnect substrate on a carrier substrate;
   forming a solder pad on a top surface of the interconnect substrate;
   forming a first solder bump on the solder pad;
   providing a semiconductor chip on the carrier substrate, the semiconductor chip being surrounded by and spaced apart from the interconnect substrate in a plan view;
   forming a polymer layer on the top surface of the interconnect substrate and on a top surface of the semiconductor chip, the polymer layer covering the first solder bump and the top surface of the semiconductor chip; and
   forming an opening in the polymer layer to expose a portion of the first solder bump,
   wherein the first solder bump is disposed on and contacts the solder pad, and
   wherein the top surface of the interconnect substrate is disposed at a higher vertical level than a bottom surface of the semiconductor chip.

10. The method of claim 9, further comprising:
    forming polymer particles in the first solder bump,
    wherein the polymer particles comprise the same material as the polymer layer.

11. The method of claim 9, further comprising:
    providing a second package including a second solder bump on a bottom surface thereof; and
    forming a reflow interconnect solder by reflowing the first solder bump and the second solder bump.

12. The method of claim 11, further comprising:
    before forming the reflow interconnect solder, performing a cleaning process on the first solder bump to remove a residue of the polymer layer provided on the first solder bump when the opening is formed.

13. The method of claim 9, wherein the providing the interconnect substrate comprises:

providing at least one base layer including a conductive member,
wherein the first solder bump is electrically connected to the conductive member.

14. The method of claim 1, wherein the polymer layer extends to a gap between the interconnect substrate and the semiconductor chip.

15. The method of claim 9, wherein the polymer layer extends to a gap between the interconnect substrate and the semiconductor chip.

16. The method of claim 9,
wherein the interconnect substrate has a hole penetrating the top surface and a bottom surface thereof, and
wherein the semiconductor chip is disposed in the hole of the interconnect substrate.

17. The method of claim 9, further comprising:
removing the carrier substrate to expose the bottom surface of the semiconductor chip and a bottom surface of the interconnect substrate; and
forming a redistribution substrate on the bottom surface of the semiconductor chip and the bottom surface of the interconnect substrate.

* * * * *